United States Patent [19]
Kandasamy et al.

[11] Patent Number: 5,513,314
[45] Date of Patent: Apr. 30, 1996

[54] FAULT TOLERANT NFS SERVER SYSTEM AND MIRRORING PROTOCOL

[75] Inventors: David R. Kandasamy, San Ramon; Mitchel B. Butler, Sunnyvale, both of Calif.; Andrew L. Foss, Yarrow Point, Wash.; Bradley M. Peterson, Los Altos, Calif.; Chintamani M. Patwardhan, Sunnyvale, Calif.; Michael T. Ribble, Los Gatos, Calif.; Dieter Rothmeier, San Jose, Calif.; Gaudencio Ramil, Milpitas, Calif.

[73] Assignee: Auspex Systems, Inc., Santa Clara, Calif.

[21] Appl. No.: 378,966

[22] Filed: Jan. 27, 1995

[51] Int. Cl.[6] .................................................. G06F 11/00
[52] U.S. Cl. .............................. 395/182.04; 364/245.3; 364/285.3
[58] Field of Search ................................... 395/375, 425; 364/240.8, 245.3, 268, 268.1, 268.3, 268.9, 285.1, 285.3

[56] References Cited

PUBLICATIONS

*Modern Operating Systems* by Andrew S. Tanenbaum ©1992 by Prentice–Hall Inc., pp. 145–146.
*Operating System Concepts* by Abraham Silverschatz et al. ©1994 by Addison–Wesley Co. Inc., pp. 349–354.
*Disk Arrays Explained* by Roger C. Alford, an article appearing in the Oct. 92 edition of Byte.
"Implementation of Ficus Replicated File System", USENIX Summer Conference, Jun., 1990, Guy, et al., pp. 63–70.
"A Highly Available Network File Server", USENIX Winter Conference, 1991, Bhide, et al. pp. 199–205.
"Deceit: A Flexible Distributed File System", NASA Report, Dec. 7, 1989, Siegel, et al. 1–34.
"A Comparison of Two Approaches to Build Reliable Distributed File Servers", Bhide, et al.
"Attributes of Total Performance for NFS File Server Users—Beyond Speed to Real–World Performance", IDC Opinion #8860, Frankle & Finos, Jun., 1994, pp. 1–7.

*Primary Examiner*—Vincent P. Canney
*Attorney, Agent, or Firm*—Fliesler, Dubb, Meyer & Lovejoy

[57] ABSTRACT

A network computer system providing for the fault tolerant storage and retrieval of data files includes a client system connected to a data communication network that may source a first data transfer request to said data communication network for the transfer or retrieval of data. A first server system, including first medium for storing data files, is connected to the data communication network so as to be responsive to first data transfer requests. A second server system, including second medium for storing data files is also connected to said data communication network to also be responsive to first data transfer requests. A control protocol, established between the first and second server systems, coordinates an asymmetric response by the first and second server systems to a first data transfer request, such that file data transferred by the client with the first data transfer request is replicated to the first and second storing mediums and such that file data transferred to the client system in response to the first data transfer is non-replicatively provided to the client system by either the first or second server system.

18 Claims, 5 Drawing Sheets

FAULT TOLERANT NFS SERVER SYSTEM AND MIRRORING PROTOCOL

BACKGROUND OF THE INVENTION

1. Field of the Invention

The present invention is generally related to fault tolerant computer systems and, in particular, to computer systems that provide fault tolerant network filesystem (NFS) data serving.

2. Description of the Related Art

With the increasing reliance on computers throughout society, increasing emphasis is placed upon providing computer systems with insured availability. In general, such systems are referred to as fault tolerant computer systems. There are a number of quite disparate system implementations of fault tolerance, largely due to how critical operations are identified. What constitutes a critical operation is, in turn, dependant on the particular type of tasks required of such computer systems. Consequently, the particular construction of fault tolerancing features implemented in any given computer system may and generally does take significantly different architectural forms.

Several common fault tolerancing considerations exist with regard to most if not all of the disparately architected computer systems. These considerations include minimizing performance loss due to the addition of fault tolerance capabilities, reducing costs and maximizing the utilization of hardware and software in a fault tolerant system, minimizing administration of the fault tolerant features, limiting the impact of the implementation of fault tolerant features on the end users of the services provided by the computer system and, finally, reducing the practical significance of architectural constraints on the expendability or modular enhancement capabilities of the computer system.

One form of fault tolerance in computer systems is known as intra-server fault tolerance. This form of fault tolerance applies to a unified computer system utilizing multiple central processor units (CPUs) operating internally in a mutually redundant fashion. A dedicated error detection control subsystem is provided typically at the CPU base level to identify any operational discrepancies in the programs executed synchronously by the redundant CPUs. A malfunctioning CPU can thus be identified and functionally eliminated from further participation in providing computer system services. The remaining CPU or CPUs may then continue to provide all requested services, pending identification and correction of the faulty CPU.

Conventional intra-server fault tolerant computer systems, though providing a high degree of reliability, inherently embody two significant disadvantages. These disadvantages include a requirement of a highly constrained or specialized architectural design and a high cost due to substantial duplicated hardware. Offsetting these disadvantages is the very high degree of reliability obtained by insuring correct operation down to an essentially machine cycle level of operation.

Another known form of fault tolerance is obtained through the close coupling of computer systems at the data subsystem level. A typical architecture employing such an inter-server approach utilizes redundant pair of computer systems cross coupled through dual ported disk subsystems. Each system is thus permitted to perform as a master initiator of disk data transfer requests. Should either of the computer systems fail, to the exclusion of the corresponding disk subsystem, the remaining computer system can have complete access to the data of the failed system.

The disadvantages of this form of fault tolerance is that there is little protection against the corruption of data written by a failing system and exposure to a failure occurring in either of the disk subsystems. There is also the significant additional cost of providing and maintaining dual-ported disk subsystems on all of the fault tolerance protected computer systems. An architectural limitation is also present in that dual-porting only allows paired systems to be mutually protected. Also, the paired systems must be mutually local, thereby requiring single site survival as a prerequisite to fault tolerant operation. Finally, a substantial performance penalty is involved at the point of any failover. Since the two computer systems only have port-based access to the disk subsystem of the other computer system, the disk subsystem of the failed host must be first cleaned and then remounted by the remaining host. Where large disk subsystems are in use, this process may take several hours.

Finally, another approach for providing fault tolerance occurs in networked computer environments. This approach operates by use of network filesystem shadowing and may be generally implemented as either a client initiated or a server-only compatibility. Client initiated shadowing requires that the client computer system send all network operation requests to two or more pre-established remote server systems. This approach to fault tolerance allows each client to independently insure the identity of the client data in two or more physically separate data storage locations. The client is, however, burdened with the responsibility of monitoring and analyzing the completion of all such duplicated requests. The client must be able to resolve both conventional network transmission errors as well as the loss of access to any of the remote network server systems.

A clear disadvantage of client initiated shadowing is, of course, the requirement for modified operating system software to be executed on each fault tolerant protected client. This approach also admits of inconsistent administration of the client shadowed data storage areas on remote servers by requiring each client to define and control the areas of fault tolerance. Client initiated shadowing also shifts the responsibility for responding to shadowing errors, and their correction, to the user of the client.

The known use of NFS shadowing at the server system level relies on delayed writes of shadowed data from a primary to a secondary server system. NFS server level shadowing thus requires only the real-time logging of all data modifications stored on one server to be replicated to at least the second server. The inter-server transfer of such logged data is performed as a low priority background task so as to have minimal impact on the normal function and performance of the primary server system. Even so, the delayed background transfer of logged data from the primary to backup server system may consume a substantial portion of the network resources of a primary server. Another problem with NFS server shadowing is that, at the point of any failover, the delayed write of logged data to the surviving system creates an exposure window for the loss of data.

Consequently, in view of the necessity of client software modification and user administration in client based NFS shadowing and the performance penalties and real potential for data loss in server based NFS shadowing, the use of NFS based fault tolerant systems has not been generally well received in the industry where data fault tolerance is a requirement.

SUMMARY OF THE INVENTION

Thus, a general purpose of the present invention is to provide a robust fault tolerant computer system and control protocol for network filesystem data transactions.

This purpose is achieved by the present invention through the use of a network computer system providing for the fault tolerant storage and retrieval of data files that includes a client system connected to a data communication network that may source a first data transfer request to said data communication network for the transfer or retrieval of data. A first server system, including first medium for storing data files, is connected to the data communication network so as to be responsive to first data transfer requests. A second server system, including second medium for storing data files is also connected to said data communication network to also be responsive to first data transfer requests. A control protocol, established between the first and second server systems, coordinates an asymmetric response by the first and second server systems to a first data transfer request, such that file data transferred by the client with the first data transfer request is automatically replicated to the first and second storing mediums and such that file data transferred to the client system in response to the first data transfer is non-replicatively provided to the client system by either the first or second server system.

The present invention thus realizes the advantage of a high degree of fault tolerance protection for data manipulated within a network filesystem environment through the use of a specialized NFS transaction protocol for insuring a robust, fault tolerance mirroring of data among two or more network file servers.

Another advantage of the present invention is that failover between a mutually fault tolerance protected server systems of the present invention is relatively instantaneous. That is, the failure detection aspect of the protocol of the present invention can detect and handle failure events consistent with recovery from normal NFS error conditions.

A further advantage of the present invention is that no additional hardware and minimal additional software is required for the implementation of the present invention. The protocol utilizes the same network connectivity existent for communication with a client to establish the fault tolerance data communication path between two or more fault tolerance server network systems. The only specific hardware cost involved is the cost of providing for additional disk data storage on each of the server systems that functions as a mirror back-up to the filesystem storage of another server system. A related advantage is that no change is required either to the system software or hardware of a client station in order to make use of the present invention. Furthermore, administration of the present invention is centralized on the server systems.

Yet another advantage of the present invention is that the fault tolerant network protocol of the present invention may be implemented on both conventional and specialized server systems and may be further operative to establish a fault tolerant pairing of server systems that are not nearly identical.

A still further advantage of the present invention is that fault tolerant operation is established in a flexible manner that allows any filesystem or other data object to be established as either a primary or back-up fault tolerant protected element. Consequently, load sharing between multiple file servers may be readily established to minimize the practical implications of establishing fault tolerance behavior between the file servers with respect to specific fault tolerance protected filesystems or data objects.

Yet still another advantage of the present invention is that each primary file server, succeeding a failover event or other operational data handling inconsistency, may readily establish a local record of all data modifications occurring from the point in time of the failover event, thereby permitting a rapid data reconstruction of the back-up file server prior to re-establishing the fault tolerant pairing of filesystems.

BRIEF DESCRIPTION OF THE DRAWINGS

These and other advantages and features of the present invention will become better understood upon consideration of the following detailed description of the invention when considered in connection of the accompanying drawings, in which like reference numerals designate like parts throughout the figures thereof, and wherein.

DETAILED DESCRIPTION OF THE INVENTION

Figure 1:
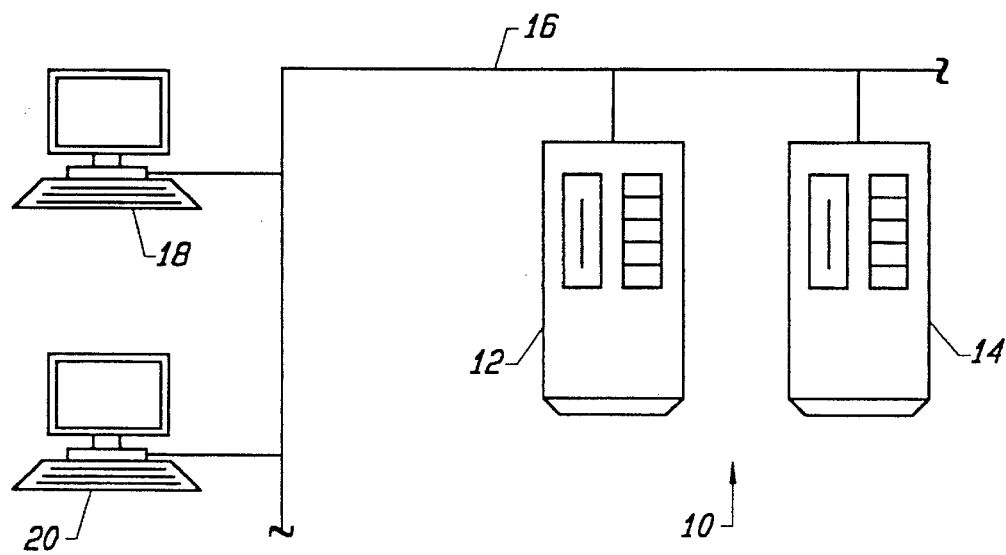
FIG. 1 is a block diagram of an inter-server system suitable for employing the fault tolerant network filesystem protocol of the present invention.

A generalized client-server architecture network based computer system 10 is shown in FIG. 1. Network data file servers 12, 14 are commonly connected to, in a typical instance, a local area network (LAN) 16. For purposes of the present invention, each of the file servers 12, 14 includes a disk subsystem at least logically partitioned into a number of mutually discrete filesystems. These filesystems represent separately manageable non-volatile disk data storage spaces. Individual client workstations 18, 20 are also connected directly, as shown, or indirectly to the LAN 16. Each of the workstations 18, 20 and file servers 12, 14, in accordance with a preferred embodiment of the present invention, may use any one of a number of variants of the UNIX™ operation system, which is generally described in Maurice J. Bach, THE DESIGN OF THE UNIX OPERATING SYSTEM, published by Prentice-Hall, Inc., Copyright 1986 by Bell Telephone Laboratories, Incorporated, which is expressly incorporated by reference herein, and specifically SunOS version 4.1 as distributed by Sun MicroSystems, Inc., 2550 Garcia Avenue, Moutain View, Calif. 94043. The preferred hardware implementation of the workstations 18, 20 is any of the workstation products of Sun MicroSystems, Inc. or Sun NFS network compatible workstation products of other manufacturers. The preferred software implementation of the file servers 12, 14 uses a modified version of the SunOS, version 4.1, operating system, generally as described in Multiple Facility Operating System Architecture, application Ser. No. 08/225,356, filed Apr. 8, 1994, assigned to assignee of the present invention and which is expressly incorporated herein by reference. The preferred hardware implementation of the servers 12, 14 is a multi-processor file server as detailed in Parallel I/O Network File Server Architecture, U.S. Pat. No. 5,163,131, issued Nov. 10, 1992; Enhanced VMEBUS Protocol Utilizing Synchronous Handshaking and Block Mode Data Transfer, application Ser. No. 08/226,398, filed Apr. 12, 1994; High Speed, Flexible Source/Destination Data Burst Direct Memory Access Controller, U.S. Pat. No. 5,175,825, issued Dec. 29, 1992; Bus Locking Fifo Multi-Processor Communication System, application Ser. No. 07/933,962, filed Aug. 24, 1992; and High-Performance Non-Volatile RAM Protected Write Cache Accelerator System, application Ser. No. 08/152,245, filed Nov. 29, 1993, all assigned to the assignee of the present invention and which are all expressly incorporated herein by reference.

In the preferred operating environment of the present invention, the fundamental transmission control protocol utilized to control the issuance and reissuance of data packets, or datagrams, onto the LAN 16 is a conventional Ethernet (CSMA/CD) protocol. Each datagram provided onto the LAN 16 is encoded with internet addresses (IPs) designating the logical source and destination of the datagram. Each logical entity present on the LAN 16 can thus potentially establish a network dialog with another entity present on the LAN 16 by specifying the assigned internet address of the destination entity in a datagram. The source internet address of the datagram allows the destination entity to responsively identify the unique source of the datagram. Each logical entity on the LAN 16 also nominally uses the destination internet address as a means for screening out datagrams not intended for that logical entity. The use and implementation of the network protocols preferably used by the present invention is described in Andrew S. Tanenbaum, COMPUTER NETWORKS, Second Edition, published by Prentice hall, 1988, which is expressly incorporated herein by reference.

In accordance with the preferred embodiments of the present invention, a fault tolerant protocol is implemented for a specific class of remote procedure calls (RPCs) transferred via the LAN 16 as a series of one or more datagrams. Specifically, the class of RPCs encompassed by the fault tolerant protocol include those known as Network Filesystem (NFS) requests. In general, NFS requests provide for two categories of operations: inquiries and updates. Inquiry requests include read data, get attributes, look up, read directory, read link, status, and null. Update requests include write data, set attributes, rename, remove directory, remove file, link, create file, make directory, and make symbolic link. These NFS requests are monitored and managed by the fault tolerant protocol of the present invention in a manner that results in the mirroring of all data within predetermined filesystems present on a primary 12 and least one secondary 14 file server. The mirroring of data to both the primary and secondary file servers 12, 14 is performed essentially concurrently in response to any client workstation 18, 20 that issues NFS requests with respect to the mirrored filesystems.

In brief, the fault tolerant mirroring protocol of the present invention provides for the secondary server 14 to operate in a proxy mode relative to all NFS requests that are otherwise specifically directed to the primary file server 12 and further identified as specific to mirror filesystems physically present on the primary and secondary servers 12, 14. Thus, by proxy operation, the secondary file server 14 concurrently performs all file creation type NFS operations and NFS data update operations requested by any client workstations 18, 20 and directed to the mirror filesystem present on the primary file server 12. Particularly due to the concurrent performance of all NFS data writes, the present invention does not incur the substantial performance penalty of the prior art where serialized data transfers are required in order to maintain synchronization of the data on secondary file servers.

The preferred approach to enabling proxy operation is to establish a virtual server system formed as a logical composite of a primary and one or more secondary servers, constituting an active group, relative to a specific set of mutually fault tolerantly protected individual filesystems. The virtual server is identified by a unique hostname and IP address. A MAC layer multicast address, commonly subscribed to and accessible by the primary and secondary servers, is also assigned to the virtual server. Client workstations access the fault tolerant protected filesystems of the active group by reference to the IP address and through the MAC multicast address of the virtual server. Consequently, NFS requests directed to the virtual server are commonly received by the primary and secondary servers of the active group.

The fault tolerant protocol of the present invention provides for the configuration of the primary and secondary servers so that multiple active groups can be formed. Each active group thus appears to be a unique virtual server the serves a set of one or more filesystems. A primary server in one active group may perform as a primary or secondary server of another active group.

The protocol of the present invention includes a set of protocols used to (1) establish and maintain coordinated operation of the primary and secondary servers in fault tolerant operation, (2) coordinate the transfer of data between client workstations and the primary and secondary servers, and (3) manage the data resynchronization of fault tolerant protected filesystems.

An exported filesystem map is used to initially define and establish coordinated operation of the primary and secondary servers of an active group. An exported filesystem map is provided on each of the primary and secondary servers 12, 14. This map establishes the identity of the local filesystems that are available, or exported, for network access. The map also defines the access privileges of other network entities to the exported filesystems. In the preferred embodiments of the present invention, this map further provides an identification of the mirror filesystems that are to be served through a virtual server system and the host name of the virtual server. Each of the export maps should be identical with respect to the mirrored filesystems of each active group. The export map also provides a preferred ordered identification of the actual server systems that are to participate the virtual server system for each of the mirror filesystems.

The exported filesystem map is consulted by a server system whenever a client requests the mounting of a filesystem. Consistent with the present invention, a mount request is issued by a client 26 against a mirrored filesystem exported by a virtual server. The request is therefore multicast to all of the servers of the relevant active group. The primary server of the relevant active group is responsible for generating an NFS filesystem ID that is to be returned to the client 26 for use in future NFS requests. The primary server 12 is also responsible for initiating a directed network transaction with each of the secondary servers 14 of the active group to provide the secondary servers 14 with the mounted filesystem name and generated NFS filesystem ID. Consequently, each of the servers of the active group maintain a common reference filesystem ID for each exported mirror filesystem.

Figure 2:
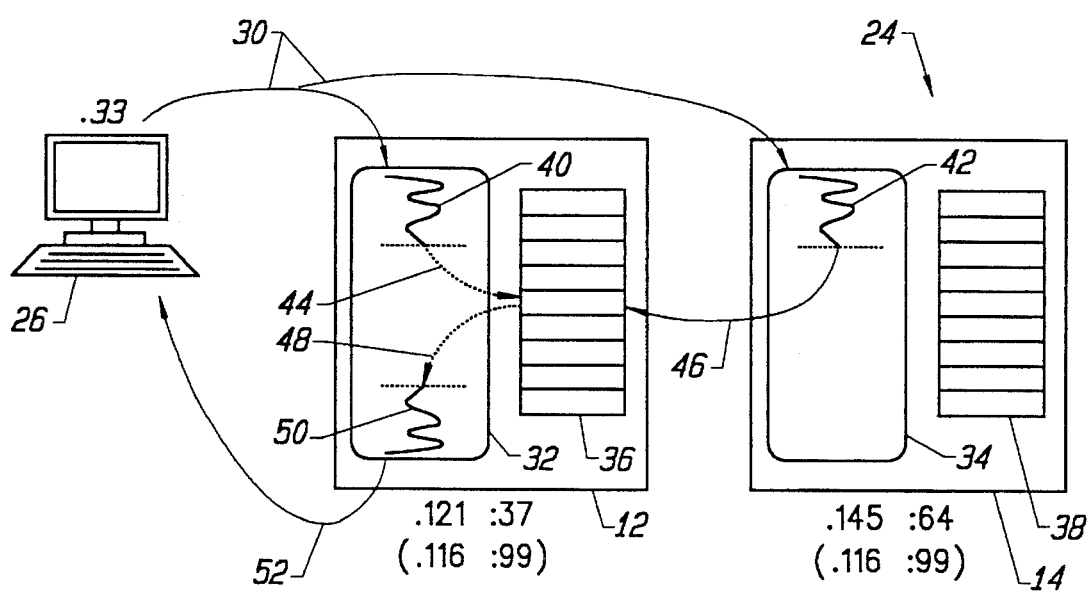
FIG. 2 is a diagram illustrating the normal client and inter-server protocol transactions necessary to implement a normal NFS write operation in a fault tolerant NFS mode in accordance with a preferred embodiment of the present invention.

The fault tolerant data protocols of the present invention will be further described in relation to FIG. 2. For purposes of description only, the network entities are assumed to have simple, non-subnetted Class "C" IP addresses. Also assumed is that the network entities are capable of mutually transmitting and receiving datagrams using a common MAC multicast address.

A client workstation 26, identified by an internet address of 0.33, may issue an NFS request to write data to a client NFS mounted filesystem physically associated with a primary file server 12 having a designated internet address (IP) of 0.121 and a MAC unicast address of :37. Since the NFS write request is to be effectively broadcast on the LAN 16, a secondary file server 14, designated with an internet address of 0.145 and a MAC unicast address of :64, simultaneously receives the NFS write request 30.

On both the primary files server 12 and secondary file server 14, the datagram representing the NFS write request is processed by a substantially conventional TCP/IP stack. In relevant part, this network stack includes a physical layer, a data link layer, a network layer, a transport layer, a session layer and an. application layer.

The physical layer on each primary and secondary server 12, 14 corresponds to the network hardware interface. The data link layer provides the lowest level of datagram integrity checking and flow control. The network layer provides IP routing services including IP destination filtering. In the preferred embodiment of the present invention, the network layer is implemented as a substantially conventional IP protocol layer, though specifically capable of accepting proxy IP destined datagrams. Proxy operation is enabled by registering a MAC multicast address, such as :99, with the network layer. For system management convenience, a virtual server system internet address 0.116 and a unique hostname are correlated to the MAC multicast address of the virtual server by initialization entries made in the address resolution protocol (ARP) tables on both the primary and secondary servers 12, 14. Consequently, datagrams transferred with reference to the internet address of the virtual server will be automatically multicast on the LAN 16 and both the primary and secondary servers 12, 14 will receive and accept such datagrams through the network layers of their respective TCP/IP stacks.

The transport layer provides connection based and connectionless transport services. The former is preferably implemented through the use of the Transport Control Protocol (TCP) and the latter through the User Datagram Protocol (UDP). Each NFS request is, in the preferred embodiment of the present invention, implemented as a remote procedure call (RPC) encapsulated in a UDP datagram. The session layer provides for the establishment of entity sessions based on an underlying connectionless protocol, including specifically UDP packets that contain NFS type RPCs. In the preferred embodiments, the RPC protocol is itself implemented in the session layer.

Finally, the application layer provides for well-known file services, such as file transfer and remote file access. An NFS server layer is the preferred embodiment of the application layer used by the present invention. Each read, write or other NFS request is managed through the NFS server under the control of generally respective network control processes (conventionally nfsd processes).

Now considering the processing of datagrams, those not having a destination IP address of 0.121 or 0.116, as received by the primary server 12, or 0.145 or 0.116, as received by the secondary server 14, are filtered out or blocked in the network layer of the TCP/IP stack. Particular to the present invention, for those NFS requests that are destined for IP address 0.116 the datagram is routed through the UDP portion of the transport layer, the RPC portion of the session layer and to the NFS server. If the NFS request is a permitted operation, as discussed, below, the file request may be processed through the virtual filesystem switch of a conventional Unix operating system kernel or directly, as in the preferred embodiment, to the UNIX filesystem (UFS) portion of the operating system. The UFS 32 is responsible for processing the NFS originated request whereby filesystem data may be read or written to disk. Conventionally, the results of such disk read and write operations are waited on by the UFS 32 before returning any appropriate data and acknowledging completion of the operation ultimately to the client workstation 26.

There are several determinations that are made by the NFS server prior to permitting an NFS request to be processed by the UFS 32. An initial determination must be made as to whether the request is directed to an exported filesystem of the virtual server that is mounted and available. Another determination is whether this actual server is the active primary server or a secondary server for the specific NFS referenced mirror filesystem. These determinations are further made in conjunction with the conventional determination of whether the request is directed to an exported filesystem for which the requesting client workstation has proper access privileges.

A determination is also made by the NFS server as to whether the specific NFS request is a duplicate of a prior received and potentially prior processed request. Thus, for each received NFS request, an entry is made in a Duplicate Request Cache (DRC) structure maintained in-memory by the NFS server. This structure, as modified for use in conjunction with the present invention, is detailed in Table I below.

TABLE I

Duplicate Request Cache

| struct dupreq { | | |
|---|---|---|
| u_long | dr_xid; | /* transaction ID */ |
| u_long | dr_proc; | /* procedure called */ |
| u_long | dr_vers; | /* version number called */ |
| u_long | d_prog; | /* program number called */ |
| char | dr_inprogress; | /* 1 if request is in progress */ |
| char | dr_status; | /* status of original reply */ |
| u_short | dr_port; | /* UDP port of sender */ |
| struct in_addr | dr_hostaddr; | /* IP address of |

TABLE I-continued

Duplicate Request Cache

```
                                    sender */
struct timeval      dr_timestamp;   /* time stamp */
struct duprply      *dr_reply;      /* reply for non-
                                    idempotent req */
struct dupreq       *dr_next;       /* LRU cache
                                    chain */
struct dupreq       *dr_chain;      /* hash chain */
#ifdef FTNFS
    char            dr_ack;         /* bit mask of
                                    backup acks rec'd */
    u_long          dr_inode;       /* new file inode
                                    and generation */
    u_long          dr_generation;  /* as provided by
                                    the primary */
#endif /* FTNFS */
};
```

The DRC structure is used to successively record all NFS requests that are accepted for execution by the NFS server. The entries are cached indefinitely, though subject to a least recently used (LRU) entry replacement algorithm. Thus, before an NFS request is accepted and passed to the UFS 30 for execution, the DRC structure is searched to identify any entry that represents a prior duplicate of the present NFS request. This operation of the DRC structure allows for the practical, imperfect nature of the LAN connection between clients and servers wherein datagrams can be lost, corrupted, duplicated, routed out of order, and delayed. Of particular significance is that when NFS requests or their responsive completion datagrams are lost, corrupted, or simply delayed in their delivery, a client workstation may reissue the original NFS request. If the NFS server encounters such a duplicate request, the new request is generally discarded. If the requested operation is currently in progress, the operation continues to its normal conclusion. If the request operation has already completed and a completion datagram sent to the client workstation, though apparently not received, the completion datagram is resent. In general, a repeated completion datagram will ultimately be received by the workstation 26.

In accordance with a preferred embodiment of the present invention, the NFS server code, including daemon process executed code generally corresponding to the function of the conventional nfsds on each participating server, is modified to implement the fault tolerant data protocols. As part of the NFS code modification, the DRC structure is also modified to include the following new data fields for each DRC entry. A dr_ack field is used as a character sized bit-map mask of the potentially multiple secondary servers that have completed this request. Each bit corresponds to one of up to eight secondary servers mapped in the ordered sequence of such servers as established in the export map statically initialized from the /etc/exports file, as further described below. The dr_inode field is specific to create file, make symbolic link, and make directory NFS requests. This field is used to store the inode number that is to be used in completing the NFS request operation; this field is only used on secondary servers. Finally, the dr_generation field is again specific to create file, make symbolic link, and make directory NFS requests. The generation number is preferably a timestamp of the time the request referenced inode was originally allocated, typically on a primary server. Since inodes are reused in the course of cyclical file creation and deletion, the generation field is used to verify whether a file referred to by an inode number is truly intended for the current instance of the inode.

The fault tolerant data protocol of an exemplary NFS write operation is shown in FIG. 2. A secondary server 14 operates as a proxy for the primary 12, at least with respect to NFS requests directed against a mirrored filesystem present physically on both of the servers 12, 14. In the preferred embodiment of the present invention, the file storage space available in the mirror filesystem of the secondary server 14 is at least as large as the corresponding mirror filesystem on the primary server 12. Likewise the number of inodes available in the secondary server mirror filesystem must be at least as many as allocated for the primary server mirror filesystem.

In order to establish proxy operation, the MAC multicast address is programmed into the network layer of the TCP/IP stack at least upon proxy initialization to pass datagrams having IP addresses that match the IP address of the virtual server. Thus, in the case of a NFS write data request 30 directed to a filesystem, designated /usr/home1, physically managed by the server 12 and mirrored by a /usr/home1 filesystem provided on the secondary server 14, the datagram containing the NFS write request and accompanying write data is delivered simultaneously by multicast to both servers 2, 14. The NFS server of server 12 recognizes the request 30 as directed to a virtual server exported filesystem for which the server 12 (hostname SvrAB-1) is designated as the primary mirror server and that a secondary mirror filesystem is present specifically on the secondary server 14 (hostname SvrAB-2).

TABLE II

/etc/exports

```
# Syntax:
#filesystem_name   keyword=ordered list of
#                  primary and secondary servers
# -- single secondary server
/usr/home1         -ftnfs=SvrAB-1:SvrAB-2
# -- two secondary servers using High Consistency Read protocol
/usr/home2         -ftnfs=SvrAB-1:SvrAB-2:SvrAB-3,HighRead
# -- alternately ordered servers to load share
/usr/home3         -ftnfs=SvrAB-2:SvrAB-1:SvrAB-3
# -- reversed primary read and write servers
/usr/home4         -ftnfsr=SvrAB-1:SvrAB-2,
                   ftnfsw=SvrAB-2,SvrAB-1
```

This information is dynamically obtained by the server 12 from the in-memory export map initially constructed from the /etc/exports data file statically stored by the server 12. The preferred format of this data file, as stored in an otherwise conventional /etc/exports data file, is generally provided in Table II.

In similar manner, the secondary server 14 also recognizes that the request is directed to a file system exported by the virtual server. By the ordering of the actual active server hostnames for the /usr/home1 filesystem, identically determined from the secondary server's own /etc/exports file, the server 14 self-determines to be the secondary mirror server with respect to this file system.

In normal operation then, the request 30 is processed through to the NFS server layers of both the primary and secondary servers 12, 14. Both create corresponding DRC entries. The NFS server of the primary server 12 ultimately passes the write data request to the UFS 32. The write data operation 40 is then executed 40 by the UFS 32. In parallel, the write data request is ultimately passed and executed 42 by the UFS 34 of the secondary file server 14. On completion of the write operation, the UFS 32 write process 40 sleeps 44 pending an update of the DRC entry corresponding to the write request 30. That is, specific for mirrored filesystems in accordance with the present invention, the write data process 40 does not immediately pass through to the generation of a completion datagram to the client on completion of the write operation. Rather, the controlling nfsd process 40 goes to sleep on a wait system call pending an update to the dr__ack field of the corresponding DRC entry. This field is updated in response to the receipt of an acknowledge datagram 46 from the secondary server 14 issued as a consequence of completion of the write operation 42.

On update of the last acknowledge field bit for the known set of secondary servers 14, the sleeping write process 40 is awakened 48 and execution continues with the generation 50 of a completion datagram 52 that is then returned to the client workstation 26.

Although the primary server 12 may sleep on completion of the write operation, and thereby introduce a delay in the generation and transfer of a completion datagram to the client workstation 36, this delay is small relative to the transfer time of large block NFS write datagrams and the absolute period of time required to write the data to the physical filesystem. The controlling factor in the length of the delay imposed by the present invention is then largely the relative difference in time required by the file servers 12, 14 to each complete the write data operation 40, 42. Where the secondary server 14 is relatively less busy, resulting in a more rapid execution of the write operation 42, the acknowledge field of the corresponding DRC entry in the structure 36 may be updated prior to completion of the write operation 40. Consequently, the added sleep delay is zero. Where the primary server 12 is relatively less burdened, the sleep delay is substantially equal to the difference in time required by the secondary server 14 to complete the write operation 42. In all normal events then, the additional delay imposed by operation of the present invention is generally only the difference in the actual write operation completion time of the servers 12, 14. Thus, the servers 12, 14 can be seen to be operating in a parallel, asynchronous or a loosely concurrent relationship that exhibits minimal re-synchronization delay in order to obtain and maintain identicality between the data stored by mirrored filesystems on the servers 12, 14.

Figure 3:
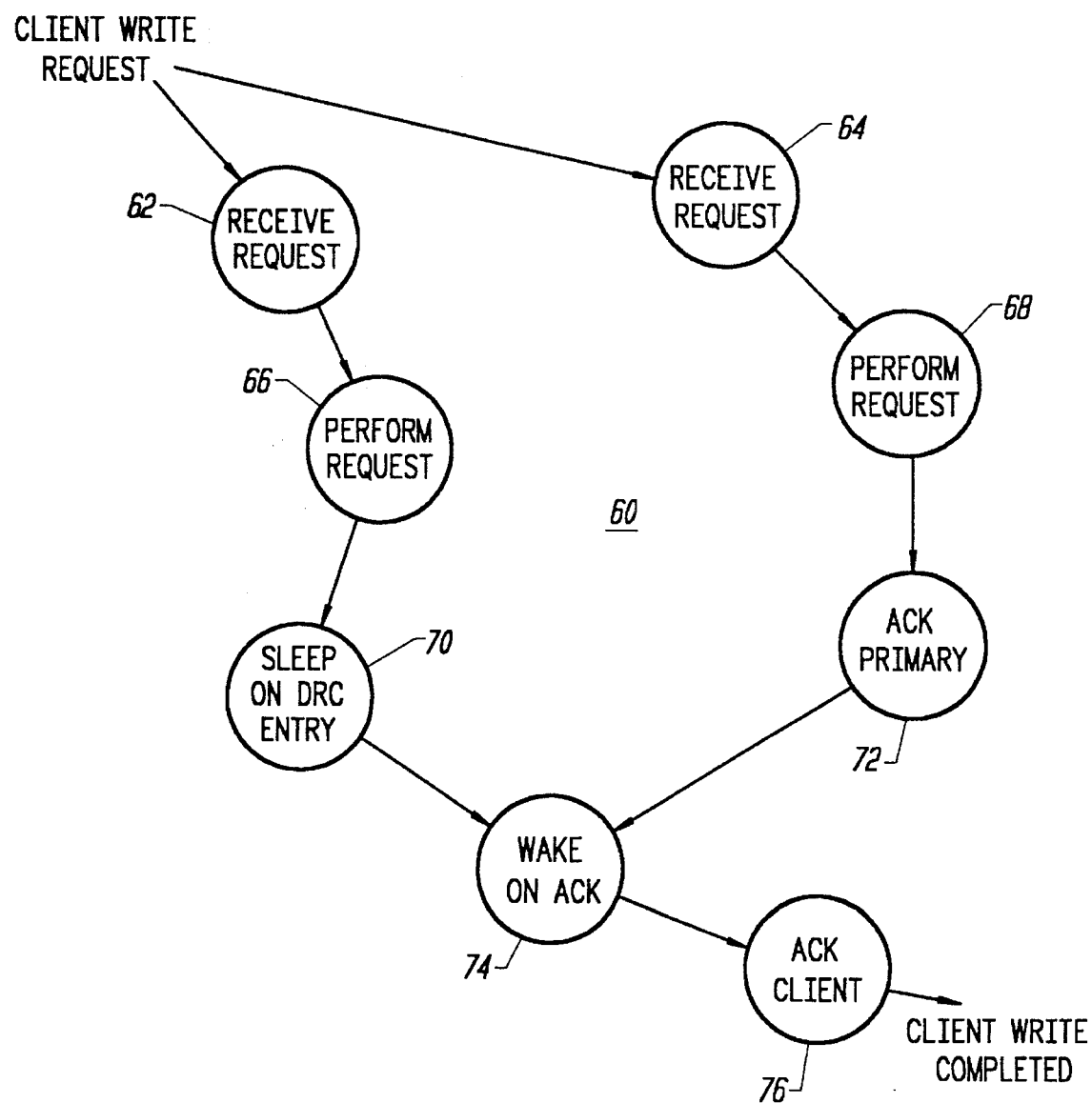
FIG. 3 provides a state transition diagram illustrating the sequence of operative states executed by a fault tolerant pairing of NFS servers in accordance with a preferred embodiment of the present invention in performance of a normal NFS write operation.

Referring now to FIG. 3, a more detailed control and data flow 60 describing a client write request operation is shown. The flow 60 illustrates the states involved in a successful completion of the NFS write request. The servers 12, 14 each receive and qualify the request 62, 64. Corresponding entries are made in the DRC table structures. The servers then asynchronously perform the write data requests 66, 68. The primary server 12, on completion of the write, initially determines whether an acknowledgment message corresponding to this write request has been received from the secondary server 14. Where an acknowledge has not yet been received, the controlling nfsd server process sleeps 70 waiting for the expected eventual receipt of an acknowledgment datagram.

When the secondary server 14 completes execution of the write request, an acknowledgment datagram is prepared and sent 72 to the primary server 12. The acknowledge datagram includes the client specified transaction ID and client IP address (dr__xid, dr__hostaddr) as specified in the originating NFS write request and recorded in the DRC entry on both the primary and secondary servers 12, 14. By using the information contained in the acknowledge datagram, the primary server 12 updates the appropriate dr__ack bit field in the DRC structure 36. The specific DRC entry is found by searching the DRC structure for a DRC entry with the same transaction ID and client IP address (dr__xid, dr__hostaddr). The specific dr__ack bit to update is determinable from the IP source address of the acknowledge datagram and by reference to the ordered list of secondary servers in the in-memory copy of the exports map. When all expected acknowledges have been received, the specific sleeping nfsd process is found by correlation to the position of the DRC entry in the DRC structure. The nfsd process is then awakened. The NFS write request process on the primary server 12 then continues on to the preparation of a conventional NFS completion datagram that is sent to the client 76.

Figure 4:
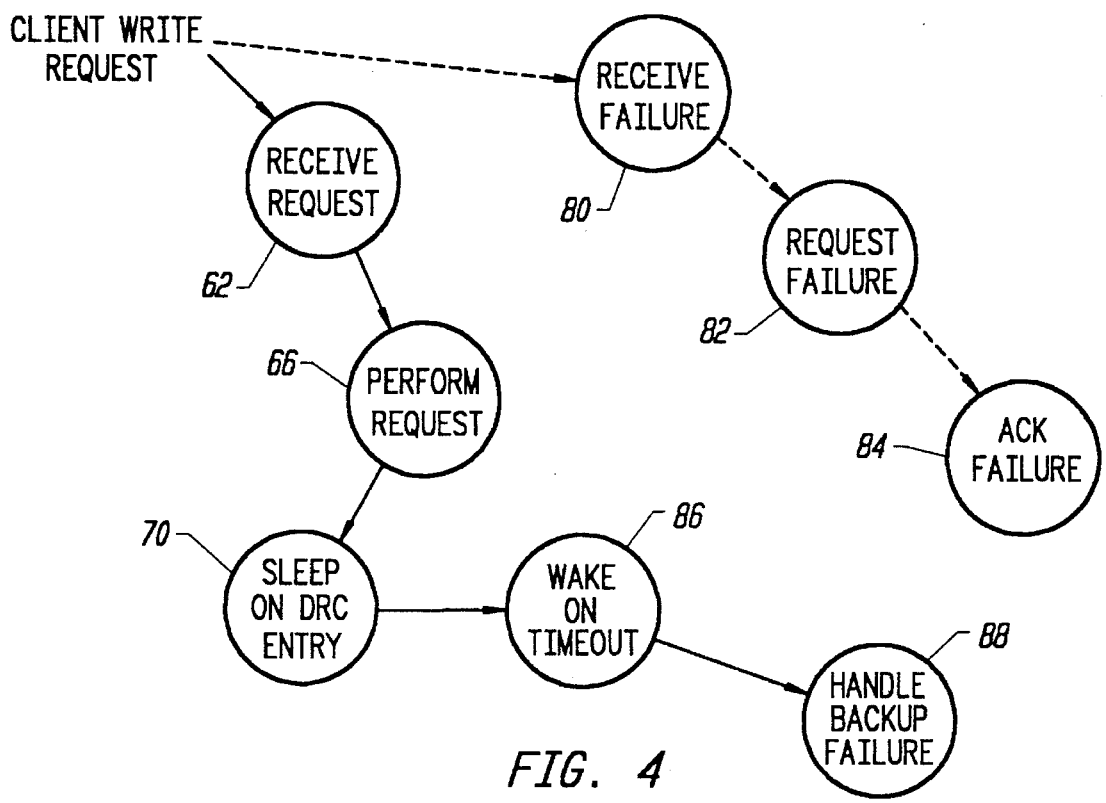
FIG. 4 provides a state transition diagram illustrating the sequence of states executed in the event of a back-up NFS server failure to complete a client write request in accordance with a preferred embodiment of the present invention.

Operation of the present invention in a secondary server failure scenario is generally illustrated in FIG. 4. Again, a client write request is issued by the client 26. The request is received and performed 62, 66 by the primary server 12. As before, the corresponding nfsd process on the primary server 12 then sleeps relative to the specific write request awaiting an acknowledgment datagram from the secondary server 14.

The primary server 12 may fail to receive an acknowledge datagram from the secondary server 14 for a number of reasons. The secondary server 14, in a first instance, may have failed to properly receive the client write request. Alternately, the secondary server 14, in performing the request, may fail for some reason to complete the request. In either case, no acknowledgment datagram is issued by the secondary server 14. Another possibility is that the client write request was properly received and performed by the secondary server 14, but the issued acknowledgment datagram was not properly received by the primary server 12.

In each of these events, the primary server 12 is left sleeping on the DRC entry for an acknowledgment datagram that is not received. However, in accordance with the present-invention, a sleep timer is set by the primary server 12 in putting the nfsd process to sleep on DRC entry. The nfsd process awakes 86 on timeout of the sleep timer in the absence of any received acknowledge datagram. Alternately, the sleep timer is effectively expired upon the aging of the DRC entry through operation of the DRC-LRU algorithm. In either event, the primary server 12 then transitions to a backup failure recovery mode 88.

Where the backup failure occurs in a circumstance where the mirrored filesystems of the active group continue to be properly available, and the integrity of the virtual server is intact but for the failure to receive the acknowledgment datagram, a partial resynchronization of the mirrored file systems is possible. The availability of mirrored filesystems is established by use of a heart-beat protocol, preferably performed on a per mirrored filesystem basis by all active group servers on the LAN 16, to continually broadcast evidence of the continuing availability of the corresponding exported filesystems on the LAN 16. Preferably, this heart-beat protocol is implemented through the issuance of a custom UDP datagram multicast to the fileservers of the active group. Where such heart-beat datagrams are still being exchanged between at least the active group servers 12, 14 of a given mirrored filesystem, thereby indicating that the mirror filesystem on the secondary server 14 is available even though a sleep event for an acknowledge packet has timed out on the primary server 12, the primary server 12 may intentionally withhold issuing any completion datagram to the client 26. Subject to the conventional operation of the NFS protocol, the client 26 will ultimately time-out waiting for the completion datagram and reissue the NFS write request.

Alternately, the primary server 12, prior to issuing a completion datagram for the NFS write request, may itself initiate a conventional NFS write operation directly to the secondary server 14 to force completion of the client requested NFS write operation. In this latter case, the NFS writes to the affected virtual server filesystem location must generally be ordered and queued pending completion of the retry as generally provided for by conventional locking protocols. In both instances, a limited number of either client or primary server 12 retries are monitored by at least the primary server 12 before a failover event is declared. Of course, should a retry be successful, the number and nature of the retries are preferably logged by the servers 12, 14 and a completion datagram is sent to the client 26.

If a failover event is declared by the primary server 12, the in-memory export map maintained by the primary server 12 for the virtual server is updated to effectively delete the secondary server references for the affected filesystem. Where other secondary servers exist for the affected filesystem, the primary server 12 maintains operation of the fault tolerant protocol of the present invention with respect to those remaining secondary servers. If all secondary servers have failed, the primary server continues operation relative to the affected filesystem generally in a conventionally NFS filesystem server mode.

The primary server 14 will declare a failover event on a per filesystem basis immediately on failure to receive a heart-beat datagram for a given mirrored filesystem within a user programmable threshold time period. The absence of these datagrams indicates that corresponding filesystem of the secondary server 14 is unavailable or that there has been a hard network communications failure between the primary and secondary servers 12, 14.

Once a failover event is declared, the primary server 12 ultimately issues a completion datagram to the client workstation 26 indicating a proper completion of the pending NFS write request. The primary server 12 also preferably logs the failover event and issues appropriate status messages to the administrator's console.

Figure 5:
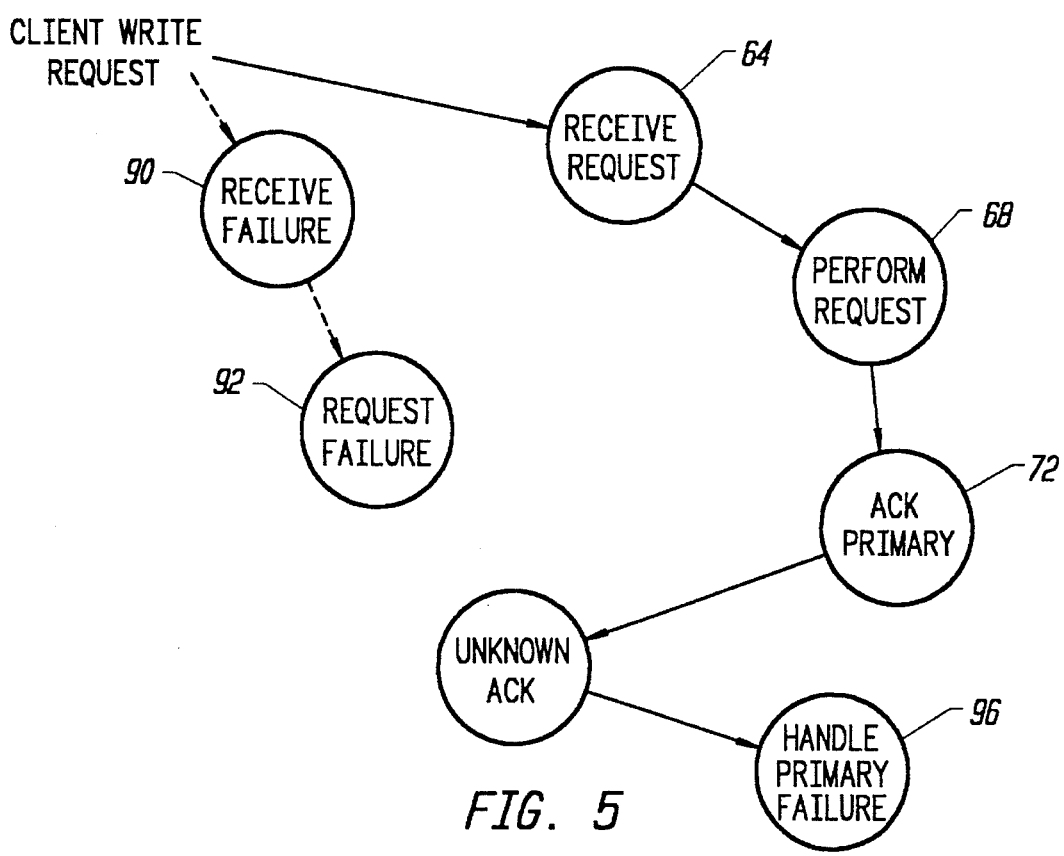
FIG. 5 provides a state transition diagram illustrating the state transitions in the event of a primary NFS server failure to perform a client write requests in accordance with a preferred embodiment of the present invention.

Referring now to FIG. 5, the failover scenario associated with a primary server failure is shown. A client write request is properly received by the secondary server 14 and performed 64, 68. An acknowledgment datagram is generated 72 and issued to the primary server 12. However, either due to an initial failure to receive the write request 90 or a failure in execution of the request 92, the client write request was not performed. In either case, a corresponding DRC entry does not exist; the DRC entry never existed or was discarded by the primary server 12 on encountering a write execution error. Consequently, the acknowledgment datagram from the secondary server 14 is received by the primary server 12 as an acknowledgment for an unknown request. The primary server 12 then transitions to a failure handling state 96.

The primary server 12 preferably sends an alert datagram to the secondary server 14. The alert datagram contains sufficient information to identify the unknown acknowledgment datagram as received by the primary server; specifically the transaction ID and client IP address provided in the unknown acknowledgement datagram. The secondary server 14 could, in symmetry to the primary server failover scenario, initiate an NFS write request to the primary server 12 to force success of the original client write request. However, a policy is preferably implemented to the effect that the data on the active primary server for a given filesystem is to be considered at all times to be correct, even in the event of a write failure. Preferably then, the secondary server 14 generally only counts and logs the receipt of such alert datagrams. The primary server 12 also counts and logs but otherwise generally ignores the unknown acknowledge datagram. Both the primary and secondary servers 12, 14 rely on the client 26 to repeat any unacknowledged NFS write request.

However, should either the primary or secondary server 12, 14 recognize that a user programmable threshold number of unknown acknowledge or corresponding alert datagrams have been received, a failover event is declared to exclude the primary server 12 from the active group mirroring the affected filesystem.

Another primary server failure scenario occurs on a partial failure of the primary server 12. In this instance, the secondary server 14 will recognize that a filesystem of the primary server 12 is unavailable by a failure recorded by the heart-beat protocol. In this event, the secondary server 14, assuming that the server 14 is the first listed secondary server, updates its in-memory export map to exclude active group participation by the primary server 12 relative to the affected filesystem and to establish the secondary server 14 as the new active primary server for the affected filesystem. Any other secondary servers similarly update their in-memory export maps to recognize secondary server 14 as the new primary server. In all events, no acknowledgment datagram is sent to the primary server 12 by the secondary server 14 at state 72. Rather, a conventional NFS completion datagram is sent directly to the client 26 by the secondary server 14.

Where a secondary server 14 looses all communication with an active primary server 12, the secondary server 14 should not assume that the primary server 12 has failed. Rather, the likely failure point is the LAN 16. In that case, the possibility of multiple active primary servers 12 serving the same file system must be avoided. Therefore, a secondary server 14 should not be promoted to an active primary state where all communication with an active primary server 12 is lost.

Figure 6:
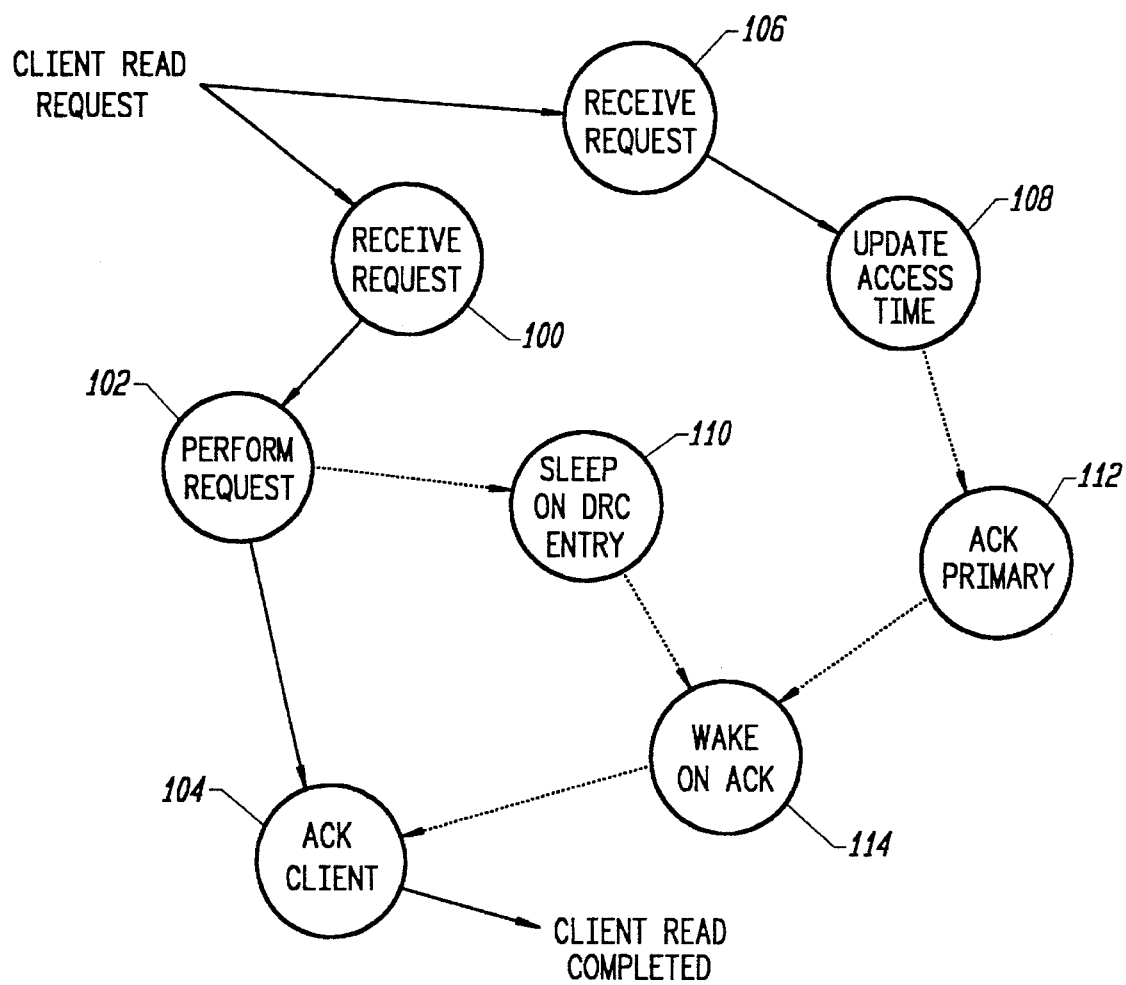
FIG. 6 provides a state transition diagram illustrating the states executed by a fault tolerant pairing of NFS servers in execution of a client read request in accordance with a preferred and an alternate embodiment of the present invention.

The present invention provides three methods of satisfying a client read request, with each method providing a greater degree of synchronization between the primary and secondary servers 12, 14. The first two methods of responding to a client read request are generally shown in FIG. 6. The first and simplest method of performing a client read request is the asynchronous read. For an asynchronous read, the primary server 12 receives the client read request 100, performs the request 102, and then immediately acknowledges completion of the read request to the client workstation 26.

The client read request is also received 106 in parallel by the secondary server 14. The read request itself is ignored, though a DRC entry is created in the DRC structure 38 on the secondary server 14. The last access time field associated with the referenced inode of the read request is also updated on the corresponding filesystem to essentially the time that the read request was received and processed by the secondary server 14. This updated access time may differ from the access time recorded for the corresponding inode on the primary server 12. However, the significance of the difference in time is mitigated by the fact that few programs are sensitive to such a slight difference in the last access timestamp of a data file. Further, the access times recorded by the secondary server will be biased in a generally consistent manner relative to the access times recorded on the primary server 12.

Where assurance that access times are properly recorded by the secondary server 14 or where a higher level of robustness in performing the read request is desired, an acknowledged read operation may be implemented. An acknowledged read differs from the asynchronous read in that the server process on the primary server 12 will sleep 110 on the primary DRC entry corresponding to the client read request rather than immediately issuing a completion datagram 104 to the client 26. The operation of the secondary server 14 similarly differs in that an acknowledgment datagram is generated 112 and issued to the primary server 12 following a successful update of the inode access time on the secondary server 14. The corresponding server process on the primary server 12 will then wake 114 in response to receipt of the acknowledgment datagram and proceed to generate and issue 104 a completion datagram to the client workstation 26 to provide the read data and signal completion of the read request.

Figure 7:
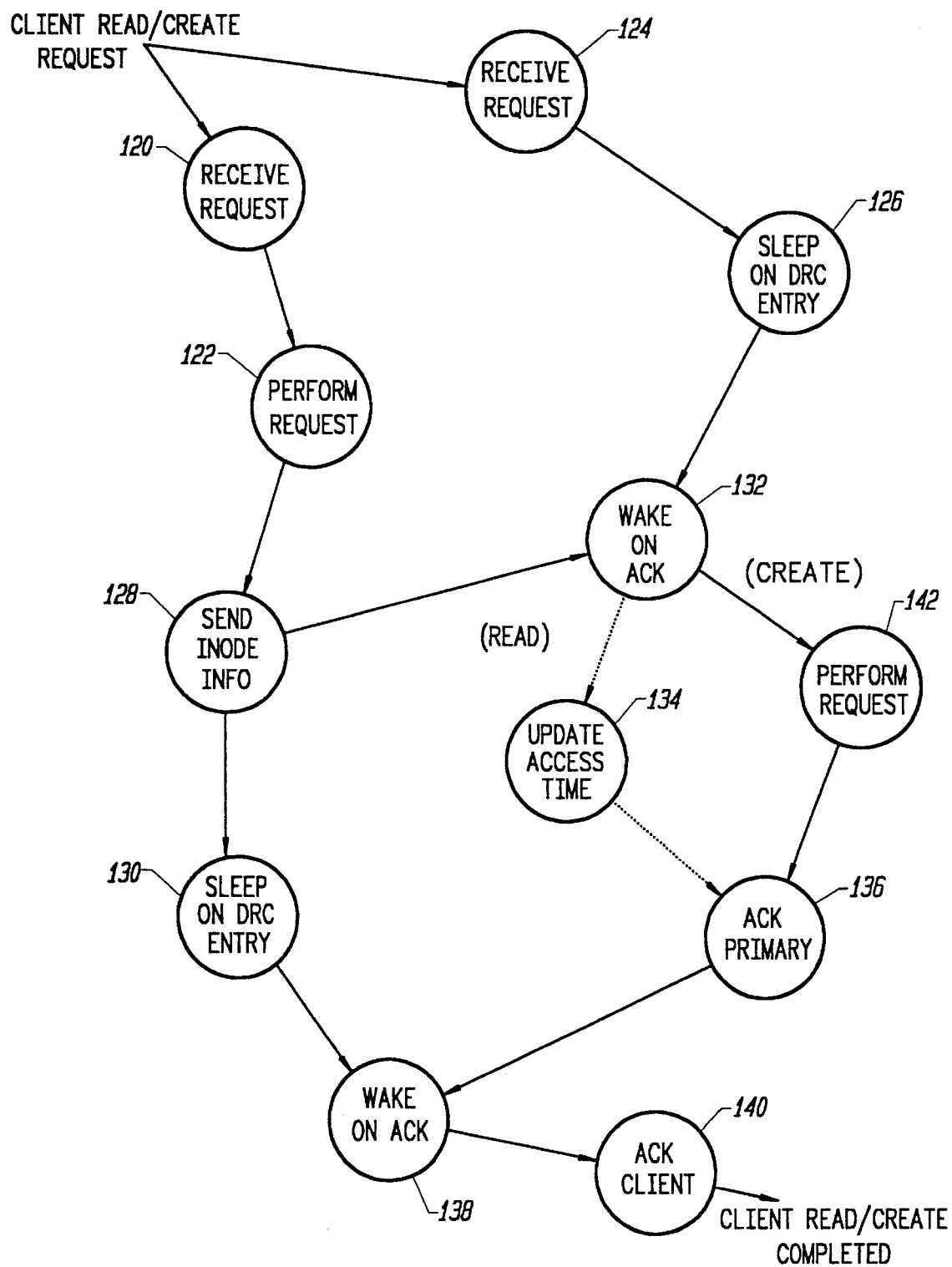
FIG. 7 provides a state transition diagram illustrating the states executed by a fault tolerant pairing of NFS servers in execution of a client create request in accordance with a preferred embodiment of the present invention.

Finally, a fully serialized method of responding to a client read request is shown in FIG. 7. The states executed by the primary and secondary servers 12, 14 are essentially the same for performing a serialized read as used in responding to a client create request, as will be discussed subsequently.

The fully serialized client read operation establishes essential identity in the inode information maintained on both the primary and secondary servers 12, 14 for the request referenced read data file. This is accomplished by establishing multiple interactions between the primary and secondary servers 12, 14 to transfer last access time inode information to the secondary server 14.

In operation, the primary server 12 receives 120 a client read request and performs 122 the requested operation. Concurrently and so far asynchronously, the secondary server 14 also receives the request 124. As with the prior methods of responding to read requests, the secondary server 14 effectively ignores the read request, though a DRC entry is prepared and entered in the DRC structure 38 on the secondary server 14. The secondary server 14 read server process then sleeps 126 on the DRC entry.

The primary server 12, on completion of the read request 122, prepares a send datagram 128 containing at least the last access timestamp of the inode read in response to the client read request, the transaction ID, inode number and the generation of the inode. This datagram is then sent to the secondary server 14 to wake 132 the sleeping server read process on the secondary server 14. The secondary server 14 then updates 134 the corresponding inode with the last access timestamp provided. The secondary server 14 then returns 136 an acknowledgment datagram to the primary server 12.

In response, the appropriate read server process on the primary server, having slept 130 on the DRC entry corresponding to the read request, is awakened 138 in response to the receipt of the acknowledge datagram. A completion datagram is then prepared 140 and forwarded to the client workstation 26.

As can be seen, the inode date information present on both the primary and secondary servers 12, 14 is maintained identically by use of the serialized read method. Identity of inode date information in this manner, however, requires serialized updating of the inodes on the primary and secondary servers 12, 14. A cumulatively significant though atomically small delay may be incurred through the use of the serialized read method.

In accordance with the present invention, the handling of the create NFS requests requires that the primary and secondary servers 12, 14 allocate directly corresponding inodes for files created on the mirrored filesystems. For these operations, the use of a serialized request response method is desirable.

The create NFS operations include: file creation, directory creation, and symbolic link creation. In each of these create operations, the essential requirement is the establishment and maintenance of uniquely corresponding inodes in each of the mirror filesystems. This is accomplished in accordance with the present invention by the transmission, from the primary 12 to the secondary server 14 and any other secondary servers, of selected inode related information first generated by the primary server 12 in performing a NFS create request 122. At least the allocated inode number, generation number and file creation timestamp, are sent 128 as part of a send datagram from the primary-server 12 to the secondary server 14 and any other secondary servers. This information is then uniquely passed by the NFS client of the secondary server 14 to the UFS 34 for use in actually performing the create request operation 142. Conventionally, the UFS 34 would independently allocate a new inode within the designated filesystem in performing a file creation operation. However, by forcing all inodes in the secondary mirror filesystem to be allocated identically as in the primary mirror filesystem, the primary server 12 can preemptively specify the new inode number to be used in the file creation operation performed by the secondary server 14. Naturally, before using the primary server specified inode number, the secondary server 14 preferably checks to ensure that the specified inode is not presently in use. If determined to be in use, a error has occurred and a failover event is declared against the affected filesystem on the secondary server 14.

Consequently, so long as client create requests are successfully executed by the secondary server 14, each inode on a mirror filesystem maintained by the secondary server 14 is created in each corresponding mirror filesystem with an identical inode number relative to the primary server 12. Consequently, subsequent client read and write requests that identify the request against a specific filesystem, inode number and generation can be commonly performed by both the primary and secondary servers 12, 14 with the assurance that the request is performed against mirrored data.

A further and desirable consequence is that, on the occurrence of a failover event, no exceptional action must be taken with regard to the client workstations that have mounted a filesystem from the virtual server. All NFS file handles held by client workstations remain equally valid as against both the primary and secondary servers 12, 14 of the virtual server. Indeed, the client workstation 26 is largely unaffected and unaware of the occurrence of any failure or failover as between the servers 12, 14.

Another consideration dealt with by the present invention is the recovery of mirrored status between mirror filesystems on the primary and secondary servers 12, 14 following the correction of the cause of a failover event. A number of different approaches to recovery are contemplated by the present invention. The simplest recovery technique is to simply quiesce the failover surviving server and copy all data files within the surviving mirror filesystem to the mirror filesystem of the rejoining server. This copy can be performed selectively based at least on last modification timestamps that are subsequent to the moment of the failover event. The exact time of occurrence of the failover event is preferably recorded at the time of occurrence by the surviving server through the /etc/syslogd service or an equivalent event logging service.

The preferred partial resynchronization approach to recovery is to provide for the logging of all file data modifications, including file creations and deletions, that are made to the mirror filesystem of the surviving server from the point of the failover event to the quiescing of read/write activity in preparation for recovery. The backup logs may store the accumulated incremental changes to the data files present on the mirror filesystem. While the mirror filesystems are otherwise quiesced, this log may simply be transferred or replayed from the surviving server to the rejoining server, thereby resynchronizing the data present on the mirrored filesystems. Where write activity is not quiesced on the surviving server during the partial resynchronization, a new log of write information can be accumulated by the surviving server while writing a prior log to the rejoining server. Successive logs will be smaller until either no writes occur to the affected filesystem during the transfer of a log or, once the current log is of a sufficiently small size, writes to the filesystem on the surviving fileserver are temporarily suspended or held off until the final log is written to the rejoining server.

Finally, where the failover event is the result of a catastrophic failure of a server, the mirror filesystem of the rejoining server may need to be completely reconstructed using a full resynchronization of the affected filesystem. In this event, the filesystem of the surviving file server is quiesced and an entire filesystem copy performed to transfer an image copy of the surviving filesystem to the rejoining server. Significantly, this disk copy must be performed so as to preserve the inode number and generation designation associated with each of the files present on the mirror filesystems.

Once a data identity has been re-established between the mirror filesystems of the primary and secondary servers 12, 14, the filesystem export map stored in memory by both the primary and secondary servers 12, 14, and any other secondary servers, can be updated to reflect subsequent operation subject to the fault tolerant mirroring protocol of the present invention. The mirror filesystems can then be placed in an active state available for service with respect to client requests.

Finally, the present invention provides for a negotiation between the fileservers of an active group to establish and, as necessary, change roles as primary and secondary servers in the active group. During ordinary startup operations, the mirror filesystems that combine to form a filesystem of a virtual server cannot be assured to become available from each of the servers of the active group at the same time. Consequently, the new availability of a mirror filesystem is treated in the same manner as the filesystem of a fileserver rejoining the active group following a failover. Thus, the first fileserver of an active group, preferably with manual confirmation, will generally become the active primary for a given mirror filesystem, though the fileserver may only be listed as a secondary server for that filesystem. A partial resynchronization log is started at least with the first client workstation write to the filesystem. If, however, the partial resynchronization log has reached a user programmable size, the logging of write data will have been terminated. In that case, a full resynchronization of the mirror filesystems is required.

As a second fileserver, serving the same mirror filesystem, completes its startup, a partial or full resynchronization is performed. The mirror filesystem of the second fileserver is then included in the operation of the virtual server for that filesystem. However, the rejoining server may be the /etc/ exports listed primary server for the rejoining filesystem. Preferably then, the active primary fileserver will preferably switch to its listed secondary role for the affected filesystem and the rejoining server will assume the role of the active primary.

A fault tolerant NFS mirroring protocol has thus been described. The protocol enables substantially asynchronous mirroring of filesystems on physically separate file servers necessarily interconnected only by the pre-existing network LAN. All client requests directed to the mirrored filesystems proceed as ordinary NFS request operations and, by operation of the present fault tolerant protocol, result in concurrent operations on the separate file servers to implement the mirroring of the NFS data.

Naturally, many modifications and variations of the present invention are possible in light of the above disclosure. These modifications may include the use of redundant, alternate and concurrent LAN or other logical data connections to interconnect the client with the involved filesystem mirroring file servers. The protocol may also be applied to transport services other than the NFS class of UDP services. In particular, the protocol may be extended to cover TCP/IP protocols and other sets of RPC transactions. Finally, it should be recognized that the protocol of the present invention is not limited to inter-operability among the products of a single vendor, but may be implemented independent of the specific hardware and software executed by any particular file server. Accordingly, it is therefore to be understood that, within the scope of the appended claims, the present invention may be practiced otherwise than as specifically described herein.

We claim:

1. A computer system providing for the fault tolerant storage and retrieval of data files, said computer system comprising:

a) a client computer system connected to a data communication network, said client computer system providing a first data transfer request to said data communication network;

b) first file server computer system, including first means for storing data files, connected to said data communication network, said first file server computer system being responsive to said first data transfer request;

c) second file server computer system, including second means for storing data files, connected to said data communication network, said second file server computer system being responsive to said first data transfer request; and d) control means, distributed among and coupling said first and second file server computer systems, for coordinating an asymmetric response by said first and second file server computer systems to said first data transfer request, such that file data transferred by said client computer system with said first data transfer request is implicitly replicated to said first and second storing means and such that file data transferred to said client computer system in response to said first data transfer is non-replicatively provided to said client computer system by either of said first and second file server computer systems.

2. The computer system of claim 1 wherein data referenced by a predetermined data transfer request is stored by said first and second file server computer systems referencable by a common data identifier.

3. The computer system of claim 2 wherein said first and second file server computer systems each include means for determining whether data referencable by said common data identifier is transferrable by the other one of said first and second file server computer systems.

4. A server computer system providing for the fault-tolerant serving of data mutually communicating over a network with another server computer system and a client system in response to a network request having a source address and a destination address, said server computer system comprising:

a) a mass storage device; and b) a processor coupleable to a communications network, said processor being coupled to said mass storage device and providing for the exchange of data between said communications network and said mass storage device in response to a predetermined request for the transfer of data by a client system, said processor including means for defining qualifications applicable to the transfer of predetermined data; and means, capable of distinguishing between a multiplicity of destination addresses, for processing network requests having one of a plurality of destination addresses, said processing means selecting between a plurality of response processes based on the destination address of said predetermined request, at least one of said response processes providing for the confirmation of the mutual performance of said predetermined request with another server computer system.

5. A fileserver system comprising:

a) a first server system including a first mass storage device providing a first data storage area; and b) a second server system including a second mass storage device and providing a second data storage area, said first and second server systems being separately coupleable to a network that provides for the transmission of network requests between a client system and said first and second server systems, said first and second server systems each including means for selectively processing network requests having a predetermined network destination address, said first and second server systems each including means for coordinating between said first and second server systems the loosely concurrent processing of network requests having said predetermined network destination address by said first and second server systems.

6. The fileserver system of claim 5 wherein said coordinating means of each of said first and second server systems provides for the selection between a primary and a secondary method of processing said predetermined network request, said coordinating means of said first and second server systems providing for the selection of a single primary method from among said first and second server systems for processing said predetermined network request, the other one of said first and second server systems selecting said secondary method for processing said predetermined network request.

7. The fileserver system of claim 6 wherein said coordinating means provides for the generation of a common identification datum for said first and second data storage areas in response to said predetermined network request and wherein said single primary process provides for the generation and transmission of said common identification datum to said client system.

8. A process of cooperatively operating a plurality of file server computer systems with respect to a client computer system coupled to said plurality of file server computer systems by a communications network, said process comprising the steps of:

a) transmitting by said client computer system a predetermined file request onto said communications network;

b) selectively receiving said file request by a first file server computer system, said first file server determining to perform said predetermined file request, selectively performing said predetermined file request and transmitting a predetermined file request response onto said communications network to said client computer system; and c) selectively receiving said predetermined file request by a second file server, said second file server determining to perform said predetermined file request and selectively performing said predetermined file request.

9. The process of claim 8 wherein said predetermined file request is received by said second server computer system logically in parallel with the receipt of said predetermined file request by said first file server computer system.

10. The process of claim 8 and 9 wherein said step of receiving said predetermined file request by said first file server computer system further includes the step of determining whether a predetermined file request acknowledgement should be received from said second file server computer system prior to transmitting said predetermined file request response onto said communications network to said client computer system.

11. The process of claim 10 wherein said step of receiving said predetermined file request by said first file server computer system further includes the step of determining whether a predetermined message, responsive to said predetermined file request, should be transmitted to said second file server computer system prior to transmitting said file request response onto said communications network to said client computer system.

12. The process of claim 11 wherein said step of receiving said predetermined file request by said first file server computer system further includes the step of determining predetermined file identifier data in response to said predetermined file request and transmitting said predetermined file identifier data to said second file server computer system with said predetermined message.

13. A process of maintaining the logically synchronous operation of a plurality of file server computer systems with respect to the providing of file services to a client computer system, said process comprising the steps of:

a) providing for the transmission of file requests by said client computer system to a logical file server network address;

b) providing for a plurality of file server computer systems to receive in common file requests transmitted to said logical file server network address;

c) providing for the mutual coordination of said plurality of file server computer systems to provide a unique response to said client computer system in response to a predetermined file request.

14. The process of claim 13 wherein said step of providing for the mutual coordination of said plurality of file server computer systems includes the transmission of a predetermined request acknowledgement between said plurality of file server computer systems in response to the receipt of said predetermined file request.

15. The process of claim 14 wherein said step of providing for the mutual coordination of said plurality of file server computer systems further includes the transmission of a predetermined message between said plurality of file server computer systems in response to the receipt of said predetermined file request wherein said predetermined message provides coordinating data from a first file server computer system to a second file server computer system.

16. A method of operating a file server having a processor, a data storage device, and a network interface coupleable to a network for transmitting and receiving network messages including file requests and file responses, said method comprising the steps of:

a) establishing a first network address for enabling receipt of network communications;

b) establishing a proxy network address for enabling receipt of file requests by said network interface, said proxy network address being shared with another file server;

c) receiving a predetermined file request identified by said proxy network address, said predetermined file request defining an operation to transfer file data with respect to said data storage device;

d) determining whether to perform a file operation against said data storage device, responsive to said predetermined file request, as a primary or secondary file server with respect to said proxy network address;

e) performing said file operation either as a primary or secondary file server including, when performing said file operation as said primary file server, transmitting a file response with said proxy network address and responsive to said predetermined file request to said network and, when performing said file operation as said secondary file server, selectively transmitting an acknowledgement message to said another file server.

17. The method of claim 16 wherein said step of performing said file operation includes, when performing said file operation as a primary file server, selectively waiting for the receipt of said acknowledgement message from said another file server prior to transmitting said file response with said proxy network address and responsive to said predetermined file request to said network.

18. The method of claim 16 wherein said step of performing said file operation includes, when performing said file operation as a primary file server, transmitting a predetermined message for said another file server to said network providing predetermined information obtained from performing said file operation, waiting for the receipt of said acknowledgement message from said another file server prior to transmitting said file response with said proxy network address and responsive to said predetermined file request to said network and, when performing said file operation as said secondary file server, waiting for receipt of said predetermined message prior to performing said file operation, performing said file operation, and selectively transmitting an acknowledgement message to said file server.

* * * * *